(12) United States Patent
Berlin et al.

(10) Patent No.: US 6,552,328 B1
(45) Date of Patent: Apr. 22, 2003

(54) MICROSENSOR INCLUDING A VCSEL AND METHOD FOR ELECTRO-MECHANICAL COUPLING OF MICROSENSORS

(75) Inventors: Andrew A. Berlin, San Jose, CA (US); Elmer S. Hung, Foster City, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/510,357

(22) Filed: Feb. 22, 2000

(51) Int. Cl.[7] .............................................. H01J 40/14
(52) U.S. Cl. .................... 250/221; 250/227.14
(58) Field of Search ...................... 250/214 R, 559.13, 250/201.5, 201.3, 306, 307, 216, 221, 227.14; 257/79, 80, 81, 82, 83, 84

(56) References Cited

U.S. PATENT DOCUMENTS

| | | | | |
|---|---|---|---|---|
| 5,331,658 A | * | 7/1994 | Shieh et al. ................... 372/50 |
| 5,771,253 A | * | 6/1998 | Chang-Hasnain et al. ..... 372/20 |
| 6,127,765 A | * | 10/2000 | Fushinobu ................... 310/306 |
| 6,263,002 B1 | * | 7/2001 | Hsu et al. ....................... 372/6 |
| 6,301,274 B1 | * | 10/2001 | Tayebati et al. .............. 372/20 |

* cited by examiner

*Primary Examiner*—Robert H. Kim
*Assistant Examiner*—Courtney Thomas
(74) *Attorney, Agent, or Firm*—Finnegan, Henderson, Farabow, Garrett & Dunner, L.L.P.

(57) ABSTRACT

A microsensor including a VCSEL for use in a MEMS. By coupling the top mirror of the VCSEL to the micromechanical structure, either directly or indirectly, the motion of the micromechanical structure in response to a physical phenomenon can directly modulate the wavelength of the light emitted from the VCSEL. Also, a method for sensing and transmitting information about the configuration or motion of a mechanical structure. The method includes coupling the top mirror of a VCSEL to the mechanical structure that directly encodes information about the motion into the frequency of light emitted by the VCSEL.

13 Claims, 3 Drawing Sheets

MICROSENSOR INCLUDING A VCSEL AND METHOD FOR ELECTRO-MECHANICAL COUPLING OF MICROSENSORS

FIELD OF THE INVENTION

The present invention relates generally to the field of sensors for detecting mechanical motion, and more particularly to an opto-electro-mechanical coupling technique for MicroElectroMechanical systems (MEMS).

BACKGROUND OF THE INVENTION

Micro-Electro-Mechanical Systems (MEMS) integrate mechanical elements, such as microsensors and microactuators, and electronics on a common substrate through the utilization of microfabrication technology. MEMS are typically micromachined using integrated circuit (IC) compatible batch-processing techniques that selectively etch away parts of a silicon wafer or add new structural layers. They range in size from several micrometers to many millimeters. These systems sense, control, and actuate on a micro scale and function individually or in arrays to generate effects on a macro scale. The mechanical motion of the microsensors can be induced or altered by, for example, electric fields, chemical reactions, external motion, thermal changes, mechanical state elements, and growth of bio-agents that alter the mass of the mechanical structure.

One of the key challenges in MEMS design is finding a way to reliably detect and transmit information regarding the position and velocity of on-chip mechanical elements. A variety of electro-mechanical coupling techniques are currently employed in the MEMS field, each of which is best suited to specific applications. Some of the existing coupling techniques include, for example, capacitive measurement of the gap between two materials, spatial modulation of optical beams via rotating mirrors, optical corner cube reflectors, gratings, piezoresistive measurement of deflection, exploitation of piezoelectric effects, magnetic coupling, electrostatic gratings, and sensing of fields emitted from atomic force microscopy tips to characterize the distance to the surface of an object. Virtually all of these coupling techniques produce an electrical signal or an optical signal. Conventional coupling techniques that produce an optical signal, however, require precision alignment to read out the optical signal.

"Transmission of information using wavelength tunable Vertical-Cavity Surface-Emitting Lasers (VCSEL) is known in the prior art. VCSELs are usually grown by Molecular Beam Epitaxy (MBE) or Metal-Organic Vapor Deposition (MOCVD). They typically comprise a quantum well gain region embedded inside a one optical wavelength ($\lambda$) thick cavity between two end mirrors. The mirrors are doped n and p type to form a p-i-n diode around the active layer. The mirrors are typically made of alternating high and low refractive index materials such as gallium arsenide and aluminum arsenide, each $\frac{1}{4}\lambda$ thick."

The ability to modulate the wavelength of light emitted by a VCSEL is also known in the prior art. The cavity resonance of a laser can be written as $nL = m(\lambda/2)$ where n is the refractive index of the cavity, L is the length of the cavity, m is an integer, and $\lambda$ is the wavelength. By combining a vertical cavity laser structure with a monolithically micro-machined deformable membrane, wavelength tuning can be accomplished by changing the cavity length.

As MEMS moves into high temperature and high radiation environments, it becomes increasingly important to perform as many information processing functions as possible in the mechanical domain. The mechanical properties of materials are far more robust than the electrical properties in some harsh environments, such as aerospace, in that they are inherently immune to radiation effects.

In light of the foregoing, there is a need for a system and a method that directly couples mechanical motion of on-chip microsensors and microactuators to the optical domain for transmission without requiring precision alignment of an optical path.

SUMMARY OF THE INVENTION

Accordingly, the present invention is directed to a system and method that directly couples mechanical motion of on-chip microsensors and microactuators to the optical domain for transmission that substantially obviates one or more of the problems due to limitations and disadvantages of the related art.

"In accordance with the purposes of the present invention, as embodied and broadly described, the invention provides a method for coupling mechanical motion of a microsensor to an optical domain including providing a microsensor comprising a mechanical structure that is responsive to a physical phenomenon of measurement interest and providing at least one VCSEL having an output wavelength comprising an optical cavity with two ends and a reflector at each end. One of the reflectors of the VCSEL is then coupled to the mechanical structure and the change in the output wavelength of the VCSEL due to the change in optical cavity length resulting from the mechanical structure's response to the physical phenomenon is measured."

In another embodiment, the invention provides a micromechanical sensor including a micromechanical member that is responsive to a physical phenomenon of measurement interest. The sensor further includes a VCSEL including an optical cavity with two ends and a reflector at each end, wherein one of the reflectors is coupled to the mechanical structure and wherein the VCSEL outputs a signal having a wavelength corresponding to the physical phenomenon of interest.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
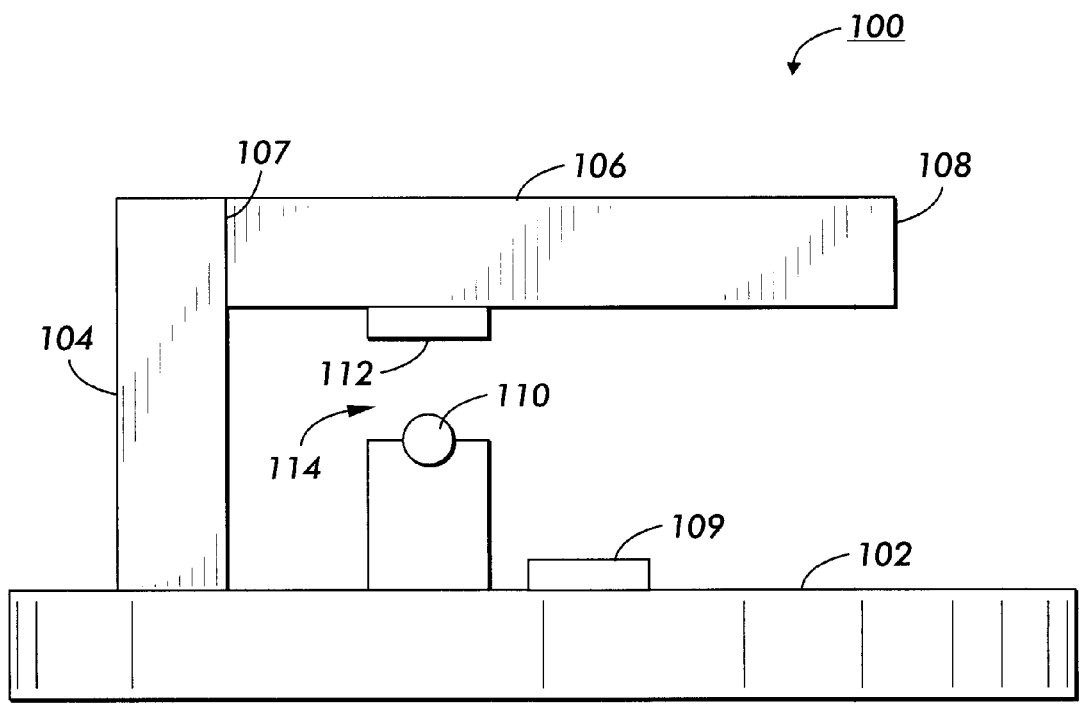
FIG. 1 is schematic side view of a sensor incorporating a VCSEL into a mechanical sensor structure.

FIG. 1 illustrates a micromechanical sensor incorporating a VCSEL into a mechanical structure consistent with one embodiment of the present invention. Sensor 100 includes substrate 102, usually a silicon wafer or GaAs wafer although other base materials are suitable as well. Anchor 104 is fixed to substrate 102 and anchors micromechanical member 106 at fixed end 107. Micromechanical member also includes free end 108. VCSEL 110 is constructed by etching and deposition of materials onto substrate 102. VCSEL 110 includes a laser cavity defined by top mirror 112 and bottom mirror (not shown). The mirrors are typically doped n-type and p-type to form a p-i-n diode around an active layer. Top mirror 112 is coupled to micromechanical member 106. Air gap 114 exists between top mirror 112 and VCSEL 110. Sensor 100 is made using convention microfabrication techniques from materials known in the art.

Top mirror 112 is preferably located an appropriate distance along micromechanical member 106, so that the range of motion of top mirror corresponds to a change of cavity length that achieves a wide shift of emission frequency. Cavity length of VCSEL 110 is determined by the distance between top mirror 112 and a bottom mirror (not shown). The bottom mirror is mounted at the end of a semiconductor cavity opposite the end adjacent to air gap 114. Thus, the VCSEL cavity length includes the length of the semiconductor cavity plus the air gap distance. Alternatively, the positions of the top mirror and the VCSEL can be switched.

Top mirror 112 can be any highly reflective material such as aluminum-arsenide deposited on micromechanical member 106. Alternatively, top mirror 112 can be a thin reflective film deposited on a deformable membrane, such as polycrystalline silicon, polyimide, or other elastomeric polymers known in the art, that is responsive to the physical phenomenon of interest. The thin deformable membrane should preferably be constructed of a material that is optically transparent to the frequencies of light that are emitted by the VCSEL.

As free end 108 of micromechanical member 106 moves in response to the physical phenomenon of interest, spacing of air gap 114 changes altering the effective Fabry-Perot cavity length causing a change in the VCSEL's lasing wavelength. The motion of micromechanical member 106 is thereby directly encoded into the wavelength of light emitted by the VCSEL. The wavelength and change in wavelength can be detected by conventional optical sensors 109, located either on or off the substrate chip 102.

A micromechanical sensor in accordance with the present invention avoids the need for precision alignment to read out the optical signals. By modulating the mechanical motion into a frequency shift of transmitted or reflected light, it becomes practical to assign a different frequency range to each one of a plurality of components of a system of interest. Thus, one can determine the motion of each component independently without needing to carefully align an optical path to a specific component.

Although FIG. 1 shows micromechanical member 106 as a cantilevered beam, any mechanical structure that is responsive to a physical phenomenon of measurement interest can be used. Other mechanical structures includes, for example, a doubly fixed beam, a proof mass structure, and a flexible membrane. VCSEL 110 can also be coupled to a mechanical structure that represents a state variable in a computation, such as the position of a gear or the state of a bistable switching element.

Figure 2A:
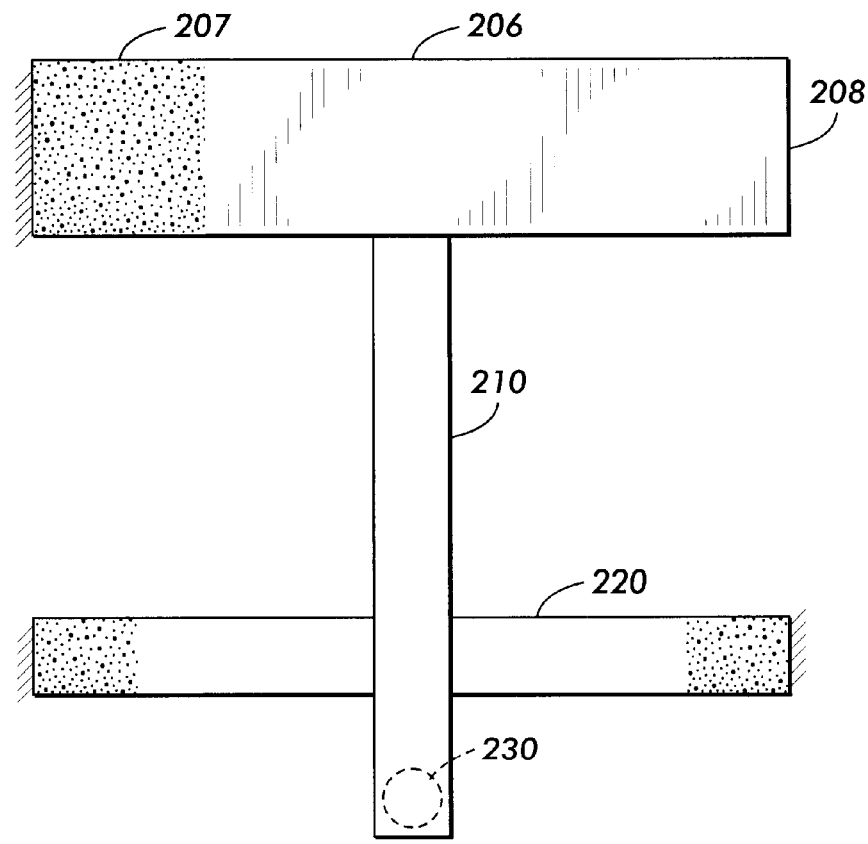
FIG. 2a is a schematic top view representation of a motion amplification mechanism for coupling a top mirror of a VCSEL and a micromechanical member.

In another embodiment, a coupling mechanism is used to indirectly couple the top mirror and the micromechanical member. As shown in FIG. 2a, coupling member 210 is attached to member 206. Fixed end 207 is anchored while free end 208 moves up and down (into and out of the page). Torsional hinge 220 is anchored at both ends and attached to coupling member 210 at an appropriate location along the length of coupling member 210. VCSEL 230 (or the top mirror) is positioned on coupling member 210 on an opposite side of torsional hinge 220 from member 206. The range of motion for the mechanical member 206 can be, for example, about 5–30 microns, while the range of motion desired for the top mirror is about 0.4 microns. Thus, coupling member 210 moves in a see saw motion with both ends alternately moving up and down (relative to the plane of the page), so that the motion range of member 206 can be scaled to the range of motion desired for the VCSEL (or top mirror).

Figure 2B:
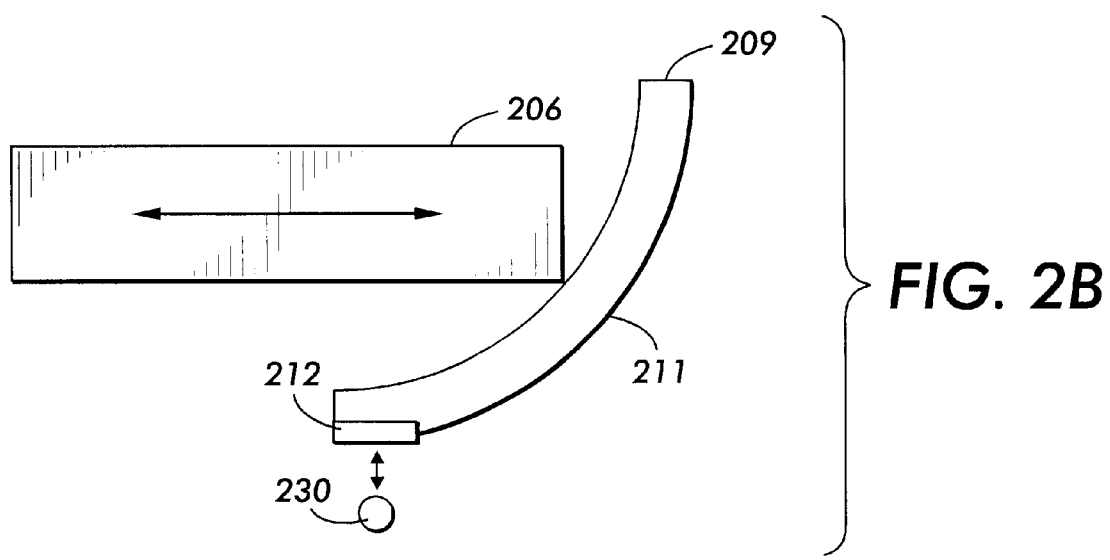
FIG. 2b is a schematic side view representation of a mechanism for coupling motion in the plane of the substrate to a plane of motion that affects the VCSEL

As shown in FIG. 2b, another coupling mechanism translates motion of the member in the plane of substrate into motion in a direction that affects the VCSEL. Member 206 moves in a direction represented by the large arrow in FIG. 2b. Structure 209, for example an upwards curving structure with pivot point 211, translates the motion of member 206 into a plane of motion, represented by the small arrow, that affects VCSEL 230 and top mirror 212.

Figure 3:
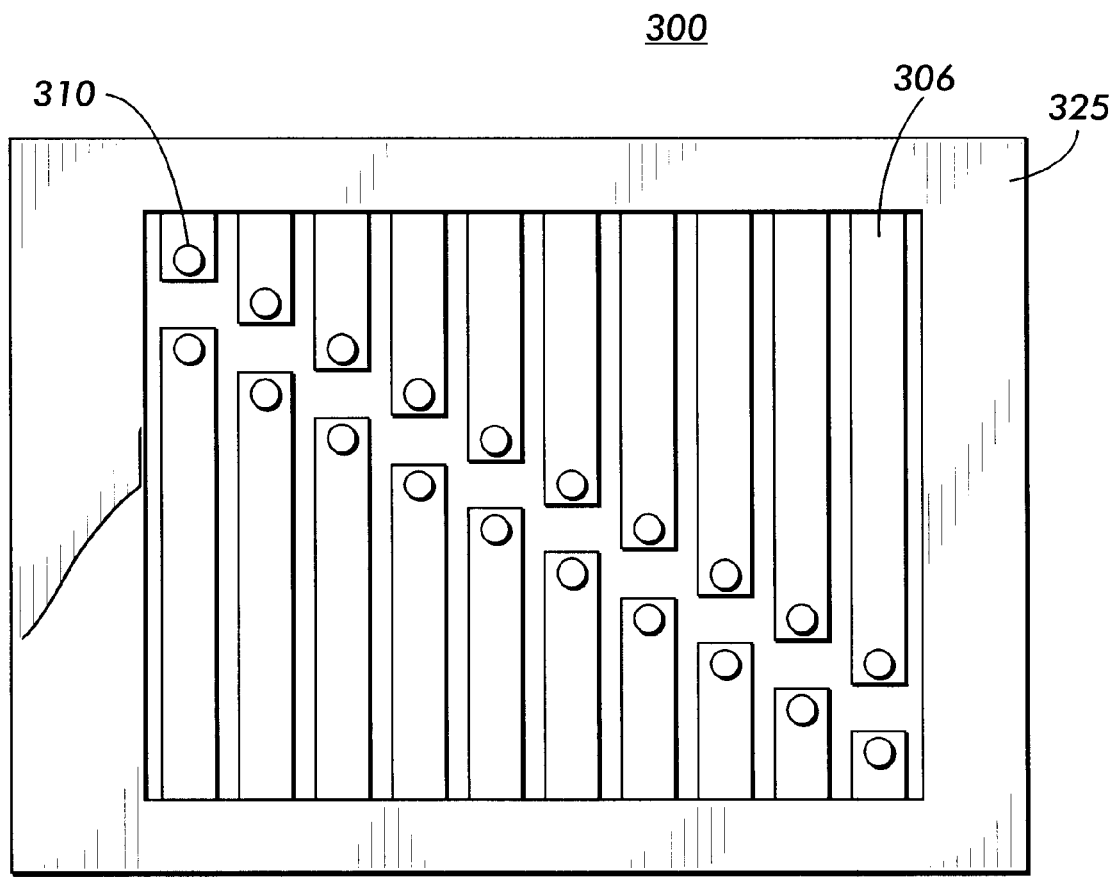
FIG. 3 is a schematic top view representation of an array of sensors wherein each micromechanical member incorporates a VCSELs into its structure.

In another embodiment shown in FIG. 3, micromechanical sensor 300 includes multiple VCSELs 310 coupled to multiple micromechanical members 306. Sensor 300 further comprises a substrate 325 coupled to micromechanical members 306, top mirrors (not shown), and air gaps between the VCSELs and the top mirrors (not shown). As with the previous embodiments, either the VCSEL or the top mirrors can be attached to the micromechanical member. For applications such as signature analysis having peaks in vibration at certain frequencies, VCSELs 310 preferably have disparate frequency ranges. As each of these frequencies is detected by mechanical structure 306, the VCSEL having a corresponding frequency range activates and produces an output that is detected by an optical sensor (not shown). In other applications, such as detection of component failure, VCSELs 310 can have the same frequency range. Although FIG. 3 shows micromechanical member 306 as a cantilevered beam, any mechanical structure that is responsive to a physical phenomenon of measurement interest can be used.

Micromechanical sensor 300 further includes optical sensors to detect the output laser light. These optical sensors can be on or off the substrate. For example, the resonant mass and VCSEL portion of the sensor can be located on the turbine of a jet engine, while the detector can be located remotely, even several meters from the VCSEL on, for example, the engine mounting. The optical sensors detect specific frequencies of emitted light using a static grating-like filter, or using a moveable grating array device that samples multiple frequencies simultaneously.

It will be apparent to those skilled in the art that various modifications and variations can be made in the micromechanical sensor and method for coupling mechanical motion of on-chip microsensors and microactuators to the optical domain. Thus, it is intended that the present invention cover the modifications and variations of this invention provided they come within the scope of the appended claims and their equivalents.

What is claimed is:

1. A method for coupling mechanical motion of a microsensor to an optical domain comprising the steps of:
   providing a microsensor comprising a mechanical structure that is responsive to a physical phenomenon of measurement interest;

providing at least one Vertical Cavity Surface Emitting Laser (VCSEL) having an output wavelength comprising an optical cavity with two ends and a reflector at each end;

coupling one of the reflectors of the VCSEL to the mechanical structure;

measuring a change in the output wavelength of the VCSEL due to the change in optical cavity length resulting from the mechanical structure's response to the physical phenomenon.

2. The method of claim 1, wherein a plurality of VCSELs are provided and one of the reflectors of each VCSEL is coupled to the mechanical structure.

3. The method of claim 2, wherein each of the plurality of VCSELs has a disparate frequency range.

4. The method of claim 1, wherein the VCSEL is indirectly coupled to the mechanical structure by a coupling mechanism.

5. The method of claim 4, wherein the coupling mechanism scales the response of the mechanical structure to a desired optical cavity length for the VCSEL.

6. The method of claim 4, wherein the coupling mechanism translates the response of the mechanical structure to a motion that affects the cavity length of the VCSEL.

7. A micromechanical sensor comprising:

a micromechanical member that is responsive to a physical phenomenon of measurement interest;

a VCSEL comprising an optical cavity with two ends and a reflector at each end, wherein one of the reflectors is coupled to the mechanical structure and wherein the VCSEL outputs a signal having a wavelength corresponding to the physical phenomenon of interest.

8. The micromechanical sensor of claim 7, further comprising a plurality of VCSELs wherein one of the reflectors of each VCSEL is coupled to the mechanical structure.

9. The micromechanical sensor of claim 8, wherein each of the plurality of VCSELs has a disparate frequency range.

10. The micromechanical sensor of claim 7, wherein the VCSEL is indirectly coupled to the mechanical structure by a coupling mechanism.

11. The micromechanical sensor of claim 10, wherein the coupling mechanism scales the response of the mechanical structure to a desired optical cavity length for the VCSEL.

12. The micromechanical sensor of claim 10, wherein the coupling mechanism translates the response of the mechanical structure to a motion that affects the cavity length of the VCSEL.

13. The micromechanical sensor of claim 10, further comprising an optical detector for sensing the wavelength of light output by the VCSEL.

* * * * *